(12) United States Patent
Ando et al.

(10) Patent No.: US 9,723,731 B2
(45) Date of Patent: Aug. 1, 2017

(54) ELECTRONIC DEVICE FOR VEHICLE

(71) Applicant: DENSO CORPORATION, Kariya, Aichi-pref. (JP)

(72) Inventors: Hiroaki Ando, Kariya (JP); Kiminobu Inayoshi, Kariya (JP); Tetsuichi Takeuchi, Chiryu (JP); Naoto Makino, Anjo (JP); Tetsuya Sueyoshi, Okazaki (JP); Kenichi Katoh, Kasugai (JP); Keisuke Nishio, Tokai (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 14/784,080

(22) PCT Filed: Apr. 3, 2014

(86) PCT No.: PCT/JP2014/001954
§ 371 (c)(1),
(2) Date: Oct. 13, 2015

(87) PCT Pub. No.: WO2014/171097
PCT Pub. Date: Oct. 23, 2014

(65) Prior Publication Data
US 2016/0066439 A1 Mar. 3, 2016

(30) Foreign Application Priority Data
Apr. 19, 2013 (JP) ................................ 2013-088314

(51) Int. Cl.
*H05K 5/00* (2006.01)
*H05K 3/34* (2006.01)
(Continued)

(52) U.S. Cl.
CPC ..... *H05K 5/0013* (2013.01); *H01L 23/49838* (2013.01); *H05K 1/0213* (2013.01);
(Continued)

(58) Field of Classification Search
USPC .................................................. 361/752, 767
See application file for complete search history.

(56) References Cited

U.S. PATENT DOCUMENTS 6,479,758 B1 * 11/2002 Arima ............... H01L 23/49838
174/260
6,927,491 B1    8/2005 Yamada
(Continued)

FOREIGN PATENT DOCUMENTS

JP    2001177226 A    6/2001
JP    2003023243 A    1/2003
(Continued)

OTHER PUBLICATIONS

International Search Report and Written Opinion (in Japanese with English Translation) for PCT/JP2014/001954, mailed May 13, 2014; ISA/JP.
U.S. Appl. No. 14/763,844, filed Jul. 28, 2015, Sueyoshi et al.

*Primary Examiner* — Andargie M Aychillhum
(74) *Attorney, Agent, or Firm* — Harness, Dickey & Pierce, P.L.C.

(57) ABSTRACT

A vehicular electronic device has a semiconductor package and a multilayer wiring board. An electrode pad of the multilayer wiring board, to which a signal terminal of the semiconductor package is soldered, has a wiring pattern in an inner layer of the multilayer wiring board. A solder resist is applied and spaced from a periphery of the electrode pad to the exterior. The signal terminal is soldered to the electrode pad to cover an upper surface and an upper end of a side surface of the electrode pad. As a result, a crack is less likely to occur in solder connected to the signal terminal. Therefore, the signal terminal can be electrically connected with high reliability even when the signal terminal is provided in the semiconductor package with a small number.

9 Claims, 6 Drawing Sheets

(51) Int. Cl.
*H05K 1/11* (2006.01)
*H01L 23/498* (2006.01)
*H05K 1/18* (2006.01)
*H05K 1/02* (2006.01)
*H01L 23/50* (2006.01)

(52) U.S. Cl.
CPC ........... *H05K 1/0298* (2013.01); *H05K 1/113* (2013.01); *H05K 1/181* (2013.01); *H05K 3/3436* (2013.01); *H05K 3/3452* (2013.01); *H01L 23/50* (2013.01); *H01L 2224/16013* (2013.01); *H01L 2924/3512* (2013.01); *H05K 1/0271* (2013.01); *H05K 2201/0989* (2013.01); *H05K 2201/09436* (2013.01); *H05K 2201/10674* (2013.01); *Y02P 70/613* (2015.11)

(56) References Cited

U.S. PATENT DOCUMENTS

| | | | |
|---|---|---|---|
| 2004/0046252 | A1 | 3/2004 | Fujimori et al. |
| 2005/0087364 | A1 | 4/2005 | Umemoto |
| 2006/0169484 | A1 | 8/2006 | Yamashita et al. |
| 2006/0273461 | A1 | 12/2006 | Otsuka |
| 2013/0279134 | A1* | 10/2013 | Hayashi ............... H05K 1/0216 361/767 |

FOREIGN PATENT DOCUMENTS

| | | |
|---|---|---|
| JP | 2004103928 A | 4/2004 |
| JP | 2005129663 A | 5/2005 |
| JP | 2006339524 A | 12/2006 |
| WO | WO-2006064863 A1 | 6/2006 |

* cited by examiner

ELECTRONIC DEVICE FOR VEHICLE

CROSS REFERENCE TO RELATED APPLICATIONS

This application is a U.S. National Phase Application under 35 U.S.C. 371 of International Application No. PCT/JP2014/001954 filed on Apr. 3, 2014 and published in Japanese as WO 2014/171097 A1 on Oct. 23, 2014. This application is based on and claims the benefit of priority from Japanese Patent Application No. 2013-088314 filed on Apr. 19, 2013. The entire disclosures of all of the above applications are incorporated herein by reference.

TECHNICAL FIELD

The present disclosure relates to a vehicular electronic device that can be equipped to a vehicle.

BACKGROUND ART

Such a kind of vehicular electronic device has, for example, a microcomputer and controls several devices (sensor and actuator). Recently, a vehicular control device has been electronized. For example, not only a conventional navigation function but also various services such as cooperation with an external center or control of a vehicle behavior have been put into practice.

To put such various controls into practice, the number of semiconductor packages equipped to a board increases. To equip the semiconductor packages to a multilayer wiring board, solder is formed on electrode pads disposed on the multilayer wiring board and a component is mounted thereon (for example, see patent literature 1).

According to an art described in patent literature 1, an electrode pad has a laterally-long shape. A solder resist covers an upper end of the electrode pad and an opening is formed in the solder resist. A width of the opening of the solder resist is shorter than a width of the laterally-long shape of the electrode pad. A center of the opening is offset from a center of the laterally-long shape in a direction toward a center of an IC to be soldered. As a result, an occurrence of an operation failure caused by a solder crack due to a variation in temperature can be reduced in the multilayer wiring board to which the IC is flip-chip bonded.

PRIOR ART LITERATURE

Patent Literature

Patent Literature 1: JP2005-129663A

SUMMARY OF INVENTION

When the solder resist covers the upper end of the electrode pad, as described in patent literature 1, in a semiconductor package having a predetermined structure (for example, Ball Grid Array (BGA)-type package), it was found that a crack is likely to occur in a contact portion between an upper surface of the solder resist covering the electrode pad and the solder in a temperature cycling test that assumes harsh environment in the vehicle.

The semiconductor package is mounted on the multilayer wiring board and has a signal terminal and power supply terminals. A power supply input function is generally assigned to plural power supply terminals. In contrast, the signal terminal to which a signal input function and/or a signal output function is assigned is provided in the semiconductor package generally with a small number (for example, one terminal). Therefore, when an electrical connection failure occurs in the signal terminal, an entirety of the electronic device will not work well. Hence, it is required that the signal terminal is electrically connected with high reliability.

It is an object of the present disclosure to provide a vehicular electronic device in which a signal terminal can be electrically connected with high reliability even when the signal terminal having a predetermined function of the semiconductor package is provided in a chip only with a small number.

According to an aspect of the present disclosure, a vehicular electronic device includes a semiconductor package and a multilayer wiring board. The semiconductor package includes plural power supply terminals and a signal terminal. A power supply input function is assigned to the power supply terminals, and a signal input function and/or a signal output function is assigned to the signal terminal. The multilayer wiring board includes first electrode pads to which the power supply terminals are soldered and a second electrode pad to which the signal terminal is soldered. The multilayer wiring board has first wiring patterns connecting to the first electrode pads above a mounting surface of the multilayer wiring board on which the first electrode pads are disposed. The second electrode pad has a second wiring pattern in a layer different from a layer above the mounting surface. The signal terminal of the semiconductor package is soldered to the second electrode pad to cover an upper surface and an upper end of a side surface of the second electrode pad.

Although the first electrode pads have the first wiring patterns above the mounting surface, the first electrode pads are to be soldered with the power supply terminals of the semiconductor package. Therefore, even when a defect in a solder bonding occurs in one of the power supply terminals, power supply input can be performed properly by the other power supply terminals, which are properly soldered to the first electrode pads.

Conversely, the second electrode pad has the second wiring pattern in the layer different from the layer above the mounting surface. Since the signal terminal is soldered to cover the upper surface and the upper end of the side surface of the second electrode pad, an occurrence of a crack can be restricted.

As a result, the signal terminal can be electrically connected with high reliability even when the signal terminal having a predetermined function of the semiconductor package is provided in the semiconductor package only with a small number.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

An embodiment of the present disclosure will be described hereinafter with reference to FIG. 1 to FIG. 10.

Figure 1:
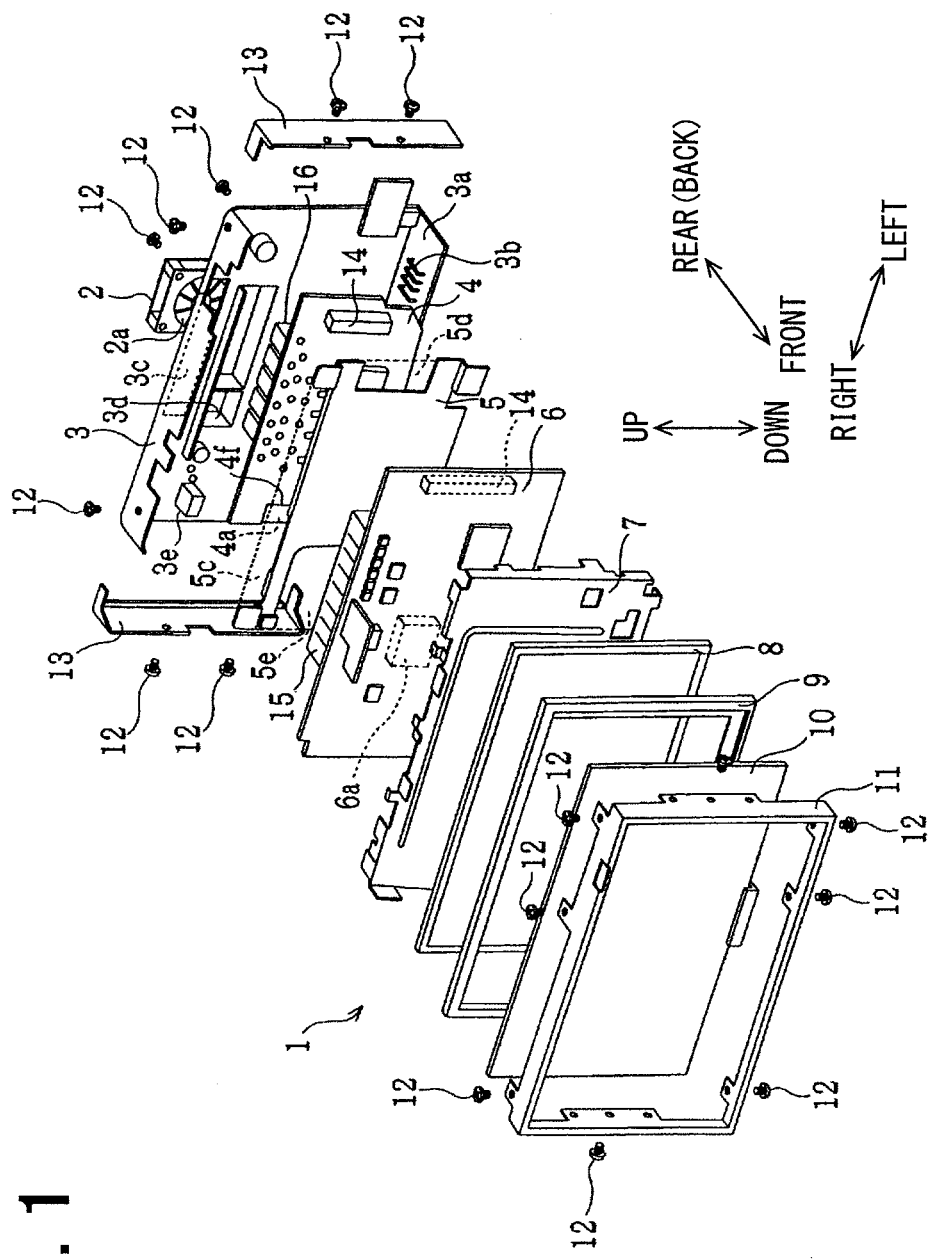
FIG. 1 is a diagram illustrating a schematic exploded perspective view of an vehicular electronic device viewed from a front side according to an embodiment of the present disclosure.

As shown in FIG. 1, an vehicular electronic device 1 includes: a metallic back cover 3 attached with a centrifugal fan unit 2 in a backmost portion of the electronic device 1; a printed wiring board 4 having a CPU or the like (corresponding to a multilayer wiring board, and hereinafter referred to as a main board) in front of the back cover 3; an interboard frame 5; a printed wiring board 6 for having an interface circuit thereon (hereinafter referred to as an interface board); a top frame 7; an LCD 8; a middle pressing frame 9; a touch panel 10; and an outer frame 11. These members 3 to 11 are assembled by screws 12 in an order described hereinabove. Along the sides of the members 3 to 11, side plates 13 are assembled by the screws 12.

Among the members, the touch panel 10, the LCD 8, the top frame 7, the interface board 6, the interboard frame 5 and the main board 4 are almost flat plate-shaped members and stacked in the order described hereinabove while keeping spaces between them.

The outer frame 11 in a front portion of the electronic device 1 has a rectangular frame shape. An inside region of the outer frame 11 is provided as a display region of the LCD 8 and an operation region of the touch panel 10. The touch panel 10 has a rectangular shape and is disposed inside of and behind the outer frame 11, so that a user operation surface faces in a front direction. The middle pressing frame 9 is provided as an outside rectangular frame of the touch panel 10. The LCD 8 is disposed behind the touch panel 10. The top frame 7 is made of a metallic member and formed into a predetermined shape. The top frame 7 is disposed behind the LCD 8.

The interface board 6 is disposed behind the top frame 7. The interface board 6 is mainly used to interface with each of other in-vehicle devices (not illustrated). Further, the interface board 6 has a component for a power supply (not illustrated) and also serves as a power supply board.

The interface board 6 does not have an opening in a same plane region as openings (hollows: see 4a and 5e of FIG. 1) formed at right sides of the interboard frame 5 and the main board 4. The interface board 6 is made of a multilayer printed wiring board. Also, the interface board 6 has electronic components such as various semiconductor packages 6a (see FIG. 1) to perform various controls specialized in a power supply control function or a vehicle control.

The interface board 6 has: a Bluetooth (registered trademark) communication component to interface with various in-vehicle devices (not illustrated); an interface component (IF); a CAN driver; a microcomputer to control input/output with the in-vehicle device; an NOR flash memory; an A/D converter (ADC); a D/A converter (DAC); a video recorder; an LED driver to drive a back light LED; and an analog selector (none of these are illustrated). Although not illustrated, the interface board 6 is electrically connectable with a battery, an external camera (R camera and S camera), DVD/DTV/etc., a data communication module (DCM), a Bluetooth antenna, a vehicle network (CAN) and a microphone, and thereby realizes an interface function.

As shown in FIG. 1, a connector (board-to-board connector) 14 is provided on a rear surface of the interface board 6. Also, a connector 14 is provided on the main board 4 and opposes to the connector 14 provided on the interface board 6. These connectors 14 connect structurally between electrical wirings of the interface board 6 and electrical wirings of the main board 4, and hence connect electrically between the components provided on the main board 4 and the components provided on the interface board 6.

As shown in FIG. 1, plural connectors 15 are disposed along an inside of an upper side of the interface board 6. The connectors 15 pass through an opening 3c of the metallic back cover 3 and connection ends of the connectors 15 protrude from a rear surface of the back cover 3. The connectors 15 connect the electrical wirings of the interface board 6 with another in-vehicle device (not illustrated) disposed behind the vehicular electronic device 1. The interboard frame 5 is disposed behind the interface board 6. The interboard frame 5 is made by molding a metallic member.

As shown in FIG. 1, the interboard frame 5 has openings 5c, 5d and 5e at an upper side, a left side and a right side. The opening 5c at the upper side allows the plural connectors 15 disposed on the interface board 6 to pass through. The opening 5d at the left side allows the connectors 14 to pass through. Also, the opening 5e at the right side is formed in an almost same plane region as an opening 4a at a right side of the main board 4 described later. The opening 5e at the right side is hollowed slightly larger than the other openings 5c and 5d.

The main board 4 is disposed behind the interboard frame 5. The main board 4 and the interface board 6 are almost parallel to each other and spaced from each other. The main board 4 is provided by a printed wiring board having multiple layers (for example, ten layers). The main board 4 has a mounting area smaller than that of the interface board 6 in a vertical direction and in a horizontal direction.

In regard to a relative arrangement position in the vertical direction, connectors 16 on a rear surface of the main board 4 are located immediately under the connectors 15 on the interface board 6. The connectors 16 connect an electrical construction of the main board 4 and each electrical block such as a navigation device, an audio device and an outside connection box (AUX Box) (none of these are illustrated).

The back cover 3 is disposed behind the main board 4. An upper side and a lower side of a rectangular flat plate of the back cover 3 are bent forward (see a bent portion 3a in FIG. 1). Plural suction ports 3b are formed at the bent portion 3a of the lower side of the back cover 3. Each of the suction ports 3b has a slit shape along a front and rear direction (front and back direction) as a longitudinal direction and is located at a left end of the bent portion 3a of the lower side of the back cover 3. Air flows from the suction port 3b to a space between each of the boards 4, 6 and the interboard frame 5.

The back cover 3, which is a metallic member, has an opening (not illustrated in FIG. 1) in the rear surface of the back cover 3 to allow the air generated by the centrifugal fan unit 2 to pass through. The centrifugal fan unit 2 is disposed behind the opening of the back cover 3. Also, the centrifugal fan unit 2 protrudes from the rear surface of the back plate of the back cover 3 toward a back direction.

The centrifugal fan unit 2 has a fan in a cylinder having an almost square shape flange. An intake port 2a of the centrifugal fan unit 2 crosses a right side 4f of the main board 4 in a plane extending in the vertical direction and the horizontal direction. The centrifugal fan unit 2 draws the air along a component mounting surface of the main board 4, and draws the air along a component mounting surface of the interface board 6 from the opening 4a. The centrifugal fan unit 2 discharges the air behind the back cover 3.

The back cover 3 has an opening 3c along an upper side of the back plate and another independent opening 3d along a lower side of the opening 3c. The openings 3c and 3d extend in the horizontal direction as the longitudinal direction.

The opening 3c along the upper side of the back plate of the back cover 3 allows the connectors 15 mounted on the interface board 6 to pass through. The independent opening 3d along the lower side of the opening 3c allows the connectors 16 mounted on the main board 4 to pass through. The connectors 15 mounted on the interface board 6 and the connectors 16 mounted on the main board 4 have dimensions greater than other semiconductor components (an IC package like a CPU or the like) in the front and rear direction.

Figure 2:
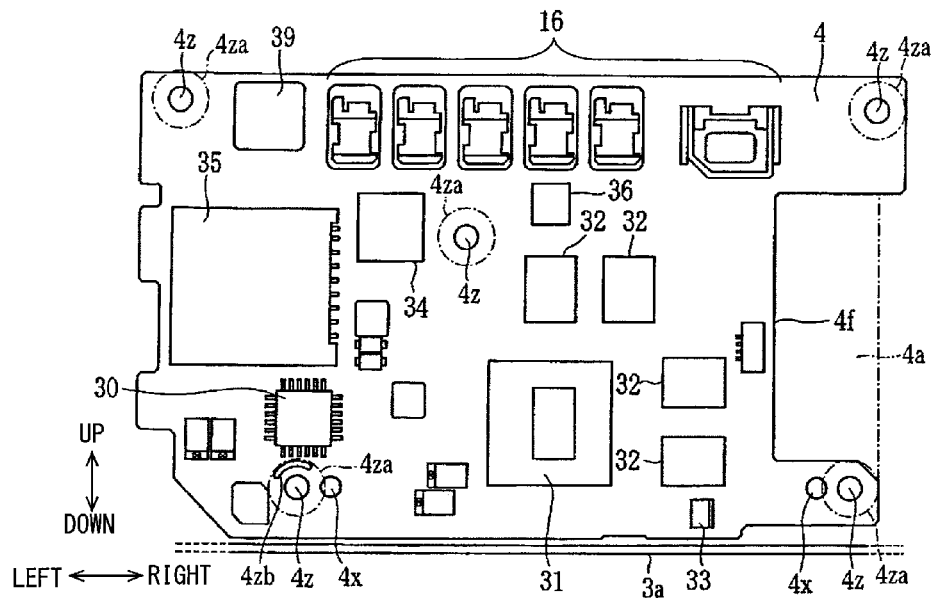
FIG. 2 is a diagram illustrating an example of an arrangement of a part of components mounted on a rear surface of a multilayer wiring board of the vehicular electronic device shown in FIG. 1.
Figure 3:
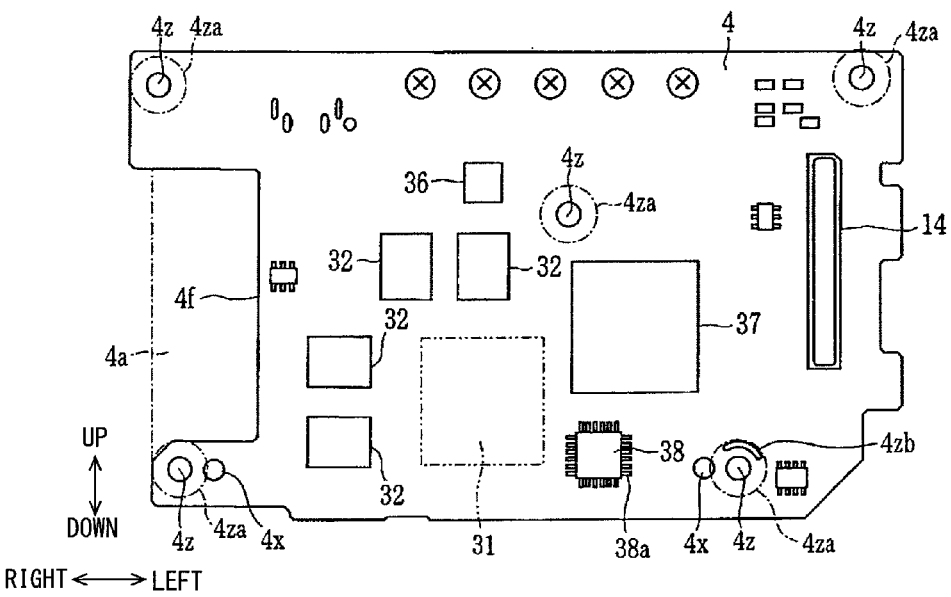
FIG. 3 is a diagram illustrating an example of an arrangement of a part of components mounted on a front surface of the multilayer wiring board of the vehicular electronic device shown in FIG. 1.

FIG. 2 illustrates the components mounted on the rear surface of the main board 4 and FIG. 3 illustrates the components mounted on the front surface of the main board 4. As shown in FIG. 2, various electronic components, such as semiconductor package components mainly for multimedia or digital data processing, are mounted on the rear surface of the main board 4. These electronic components include a power management integrated circuit (PMIC) 30, a main CPU 31, plural SDRAMs 32, a flash memory 33, an ASIC 34 for a picture processing, a connector 35 for external memory, a low voltage differential signaling (LVDS) circuit 36, an USB-Hub circuit 39 and various input/output interface connectors 16 such as a connector for a transceiver of the LVDS circuit 36 and an input/output connector of the universal serial bus (USB).

As shown in FIG. 2 and FIG. 3, the PMIC 30, the main CU 31, the SDRAM 32, the flash memory 33, the ASIC 34 for the picture processing, the LVDS circuit 36 and the USB-Hub 39 are individually built in different semiconductor packages. In the following description of component arrangements of the semiconductor packages, the components will be referred to as the same title as described above with the same symbols when being described in light of an electrical aspect. The components are referred to as the semiconductor package 30", the semiconductor package 31" and or the like with the same symbols as the electrical functional components, when being described in light of the mechanical or thermal aspect.

Since the main CPU 31 performs high speed data processing, the semiconductor package 31 generates heat. Since the PMIC 30 saves an electrical power of the main CPU 31 and monitors the power supply, the semiconductor package 30 also generates heat. That is, the main board 4 has two main heat radiation devices 30 and 31 thereon.

Since the SDRAM 32 performs high-speed communication processing with the main CPU 31 frequently, plural semiconductor packages 32 (4×2: 8 in total on the front and the rear surfaces of the main board 4) are disposed immediately along a periphery of the semiconductor package 31.

The flash memory 33 is a storage medium storing a starting program of the vehicular electronic device 1. The semiconductor package 33 is disposed immediately next to the semiconductor package 31 having the main CPU therein. These semiconductor packages 32 and 33 are disposed within a first predetermined distance from the semiconductor package 31 as a center.

As shown in FIG. 2 and FIG. 3, the opening 4a is formed at the right side of the main board 4. The opening 4a is a ventilation opening for a suction air generated by the centrifugal fan unit 2 disposed at the backmost portion of the vehicular electronic device 1. The opening 4a is necessary for cooling two boards 4 and 6 efficiently.

As shown in FIG. 2, plural SDRAMs 32 (for example, two) are arranged along an upper side of the main CPU 31. Other plural SDRAMs 32 (for example, two) are arranged in the vertical direction along a right side of the main CPU 31. Therefore, plural semiconductor packages 32 (for example, four) are soldered to the rear surface of the main board 4. The semiconductor package 33 having the flash memory therein is disposed adjacent a lower portion of the right side of the main CPU 31. As shown in FIG. 2, the LVDS circuit 36 is disposed at an upper portion of the SDRAM 32 along the upper side of the main CPU 31.

As shown in FIG. 3, the semiconductor packages of the SDRAM 32, the LVDS circuit 36, an input/output interface circuit (IOH) 37 and a clock generate integrated circuit (CGIC) 38 are mainly disposed on the front surface of the main board 4.

Plural semiconductor packages 32 (for example, four) of the SDRAM are disposed on the front surface of the main board 4 at positions respectively corresponding to the semiconductor packages 32 disposed on the rear surface of the main board 4.

The main CPU 31 disposed on the rear surface of the main board 4 communicates with the SDRAMs 32 disposed on the front surface of the main board 4 through the multilayer wirings in the main board 4. Also, the LVDS circuit 36 on the front surface of the main board 4 is disposed at a position corresponding to the LVDS circuit 36 on the rear surface of the main board 4.

These LVDS circuits 36 on the front surface and the rear surface of the main board 4 construct a receiver and a transmitter and are disposed near the connectors 16. The CGIC 38 sends a clock signal to the electronic component requiring the clock signal (for example, the main CPU 31, the input/output interface circuit 37). The semiconductor package 38 of the CGIC is disposed near a left side of the semiconductor package 31 and a lower side of the semiconductor package 37 of the input/output interface circuit.

The input/output interface circuit (IOH) 37 is bus-connected to the main CPU 31. Therefore, these semiconductor packages 31 and 37 are disposed near each other across the main board 4.

The semiconductor package 37 is disposed at an upper left portion of the semiconductor package 31 of the main CPU. Since the semiconductor package 37 and the semiconductor package 31 are disposed near each other, most of noise emission generated in a data transmission can be restricted. Also, the input/output interface circuit 37 is electrically connected to the peripheral circuit 34 and the LVDS circuit 36.

Although not illustrated, other various electronic components such as a transistor, a resistor component and a chip capacitor are disposed on the front surface and the rear surface of the main board 4. These semiconductor packages 30 to 34, 36 to 38 and other electronic component 35 are disposed on the main board 4 and spaced from through holes 4z for fixing the screws 12 by a predetermined distance or more (see areas 4za in FIGS. 2 and 3). Therefore, arrangement spaces of the front surface and the rear surface of the main board 4 are filled with the electronic components.

When electrode pads of the semiconductor packages 30 to 34, 36 to 38 are disposed near the through holes 4z, stress occurs at soldering portions welded to the electrode pads. Therefore, it is undesirable to solder the electronic components near the through holes 4z, so the electronic components are not disposed within the predetermined areas 4za around the through holes 4z on the main board 4. Also, an arc-shaped slit 4zb is formed between the semiconductor package 30 of the PMIC and one through hole 4z on the main board 4. The slit 4zb reliefs strain generated in the main board 4 and reduces the stress applied to the semiconductor package 30. Therefore, a crack in a solder connecting portion can be restricted.

Figure 4:
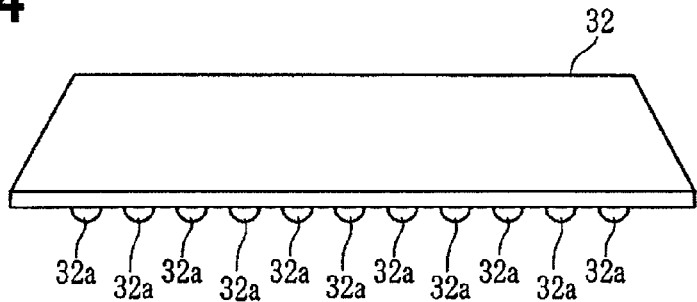
FIG. 4 is a side view illustrating an external structure of a semiconductor package of the vehicular electronic device shown in FIG. 1.

In the present embodiment, a form of mounting the semiconductor package 32 of SDRAM is characterized and will be described hereinafter. FIG. 4 schematically illustrates the semiconductor package 32. The semiconductor package 32 has a Ball Grid Array (BGA) with, for example, tens of solder balls 32a. For example, tens of solder balls 32a are disposed as terminals at a lower portion of an interposer board.

Figure 5:
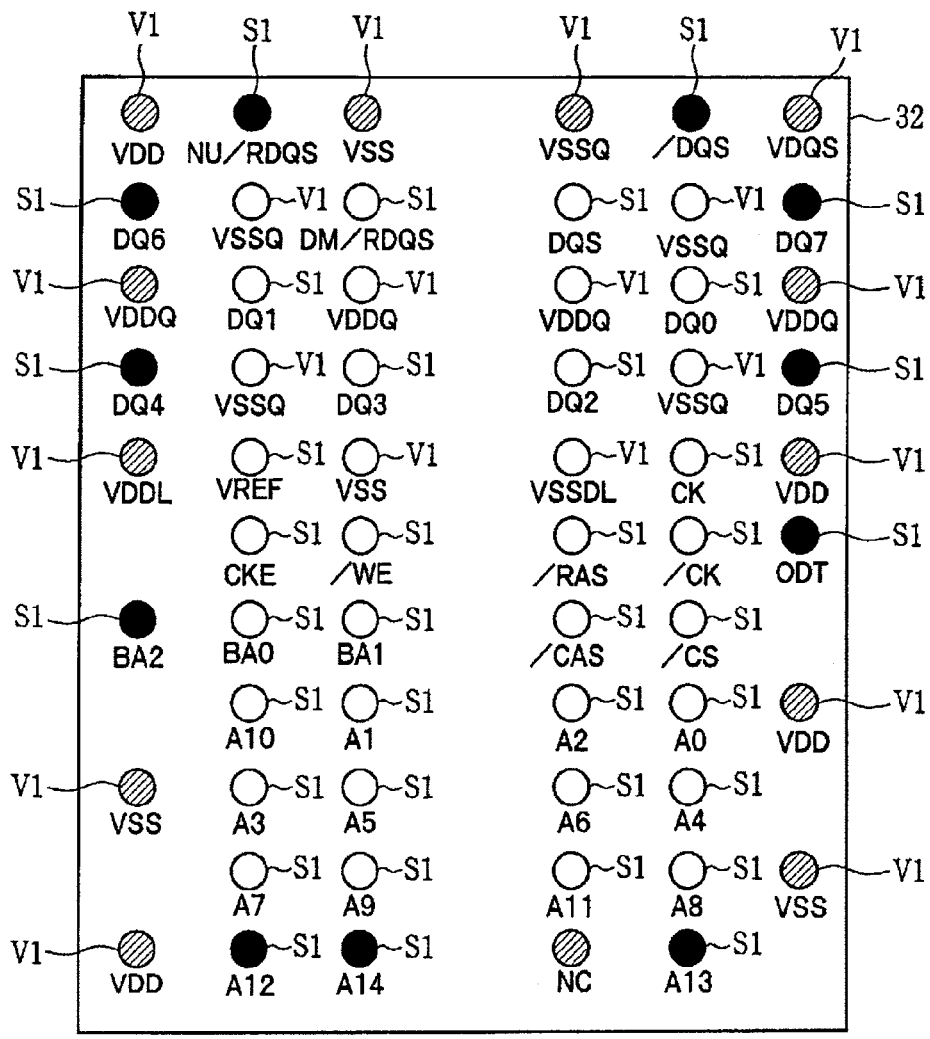
FIG. 5 is a diagram illustrating an example of an assignment of balls on the semiconductor package of the vehicular electronic device shown in FIG. 1.
Figure 6:
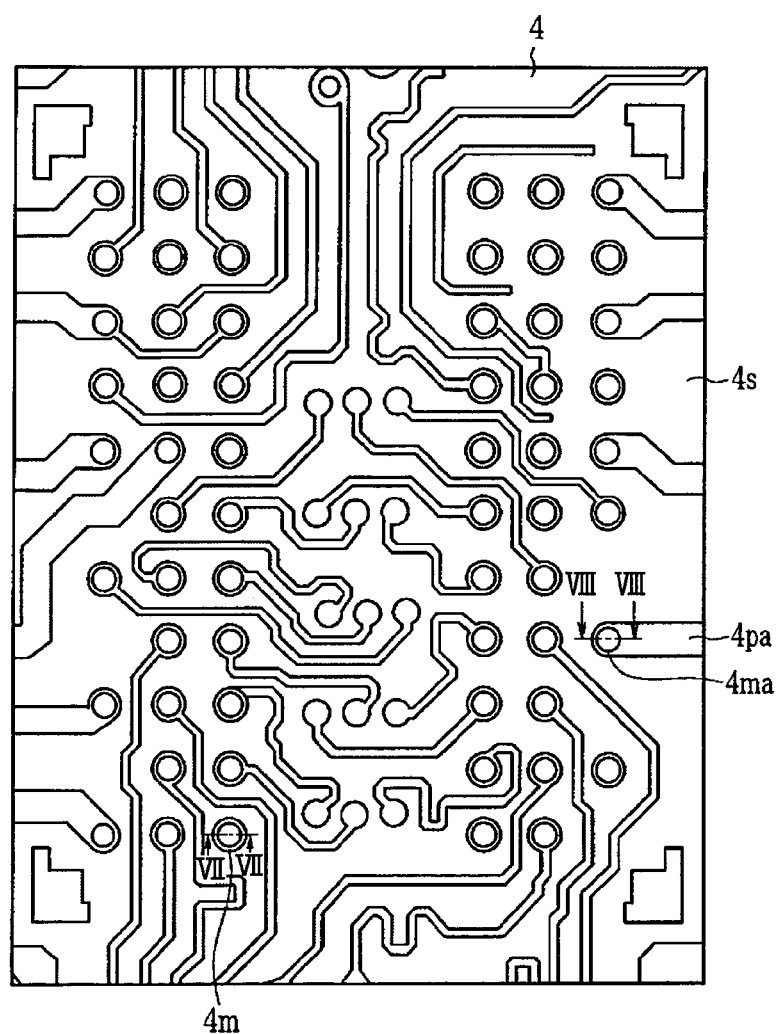
FIG. 6 is a diagram illustrating an example of a layout of wiring patterns on a mounting surface of the multilayer wiring board.

FIG. 5 illustrates an assignment of the solder balls 32a, when viewed from a lower surface of the semiconductor package 32. FIG. 6 illustrates a layout of wiring patterns on a mounting surface of the main board 4 on which the semiconductor package 32 is mounted. As shown in FIG. 5, the terminals of the semiconductor package 32 of the SDRAM can be broadly divided into power terminals V1 and signal terminals S1.

The power terminals V1 have a power supply voltage input function. The power terminals V1 individually serve as, for example, 1.8V power supply voltage terminals VDD, VDDQ, VDDL, and ground potential terminals VSS, VSSDL, VSSQ.

For example, four input terminals VDD of the 1.8 V power supply voltage are provided at an outermost portion (solder balls 32a) of the semiconductor package 32. Three input terminals VDDQ of the 1.8 V power supply voltage are provided at the outermost portion (solder balls 32a) of the semiconductor package 32. Three input terminals VSS of the ground potential are provided at the outermost portion (solder balls 32a) of the semiconductor package 32.

The signal terminals S1 each have a signal input function and/or a signal output function and serve as, for example, address input terminals A0 to A14, bank address input terminals BA and BA2, clock input terminal CK and /CK, a clock enable terminal CKE, a write enable terminal /WE, a chip select terminal /CS and data input/output terminals DQ0 to DQ3 or the like. Although a detailed description of a ball assignment is omitted, the address input terminals A0 to A14 are arranged in lower four lines in FIG. 5, for example.

These individual signal input functions and/or signal output functions are assigned to any of the solder balls 32a of the semiconductor package 32, for example, one by one. Therefore, when an electrical connection failure occurs in, for example, at least one of the signal terminals S1, the semiconductor package 32 will not function. In the present embodiment, importance is given to all of the solder balls 32a. The wiring patterns of the main board 4 are changed depending on functional priority (importance) of the solder balls 32a.

In FIG. 5, the priorities of "black circle terminal", "white circle terminal" and "hatched circle terminal" are given as follows. The first priority is "black circle terminal", the second is "white circle terminal" and the third is "hatched circle terminal". As shown in FIG. 5, the signal terminals S1 at the outermost portion of the semiconductor package 32 (for example, the data input/output terminals DQ4 to DQ7, the bank address input terminal BA2 or the address input terminals A12 to A14) have the highest priority.

The signal terminals S1 and the power supply terminals V1 at a central portion of the semiconductor package 32 have the second priority. The power supply terminals V1 at the outermost portion of the semiconductor package 32 (for example, the 1.8V power supply voltage terminal VDD and the ground potential terminal VSS or the like) have the lowest priority.

The reason for the priorities described above is that a deviation in expansion and contraction of a mounting region of the main board 4 at the outer most portion of the semiconductor package 32 is large, so the solder crack is likely to occur in the mounting region and especially the signal terminals S1 at the outermost portion are likely to be affected by the solder crack. Since the plural power supply terminals V1 are provided at the outermost portion of the semiconductor package 32 in the ball assignment, the power supply terminals V1 have the lowest priority.

Inventors of the present disclosure examined the layout of the terminals considering the priority described above and designed the layout of the wiring patterns as shown in FIG. 6. As shown in FIG. 6, in regard to each of the electrode pads 4m to which the signal terminals S1 having the high priority (for example, the address input terminal A14) are soldered, only the electrode pad 4m having a circular shape is formed on a mounting surface 4s of the main board 4.

The electrode pad 4m does not have a lead-out wiring pattern 4p above the mounting surface 4s. Alternately, the electrode pad 4m has the lead-out wiring pattern in another layer of the main board 4 (for example, an inner layer L1 immediately inside of the mounting surface 4s of the multilayer wiring board: see FIG. 7). The layout in FIG. 6 is just an example. The solder ball 32a having the highest priority may have the lead-out wiring pattern above the mounting surface 4s. On the other hand, an electrode pad 4ma to which the power supply terminal V1 having the low priority (the power supply voltage terminals VDD) is soldered has the wiring pattern 4pa connecting to the electrode pad 4ma above the mounting surface 4s.

Figure 7:
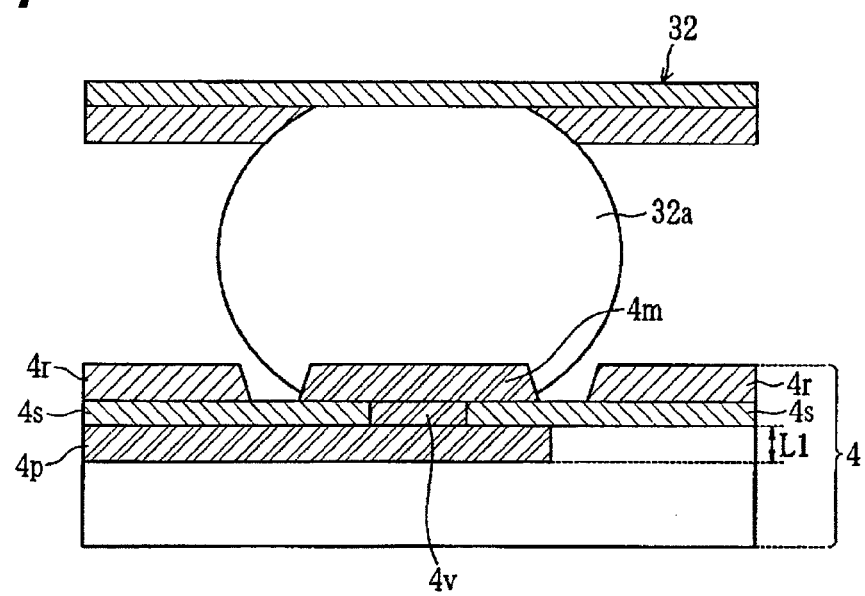
FIG. 7 is a cross-sectional view illustrating a connection state between an electrode pad of the multilayer wiring board and a terminal of the semiconductor package (part 1)

FIG. 7 is a cross-sectional view of the main board 4 taken along a line VII-VII in FIG. 6, and illustrates a structure of the electrode pad 4m and the wiring pattern 4p of the address input terminal A14. As shown in FIG. 7, the electrode pad 4m is formed above the mounting surface 4s of the main board 4. The solder ball 32a covers an upper surface and an upper end of a side surface of the electrode pad 4m.

The electrode pad 4m is connected to the wiring pattern 4p in the inner layer L1 of the main board 4 through a via 4v. A surface of the electrode pad 4a exposing from the mounting surface 4s has a circular shape in a plan view (see FIG. 6). As shown in the vertical cross-sectional view in FIG. 7, the solder ball 32a has substantially a spherical shape. An end of the sphere covers the entirety of the upper surface of the electrode pad 4m (the entirety of a circular surface in plane) and the upper end of the side surface of the electrode pad 4m.

A solder resist 4r is applied to the mounting surface 4s of the main board 4, outside of the electrode pad 4m having a predetermined distance from the electrode pad 4m. The solder resist 4r insulates and protects so that the solder ball 32a does not contact with the other wiring patterns or the circuits above the mounting surface 4s (so-called a normal resist structure).

The inventors performed a temperature cycling test (several hundreds to thousands of cycles from minus several tens degrees to plus several tens degrees) and observed an occurrence of the solder crack. As a result, it was confirmed that a soldering structure shown in FIG. 7 reduces the occurrence of the solder crack and secures a long-term reliability even when the electronic device 1 is equipped to the vehicle that is likely to be exposed to harsh environment.

Figure 8:
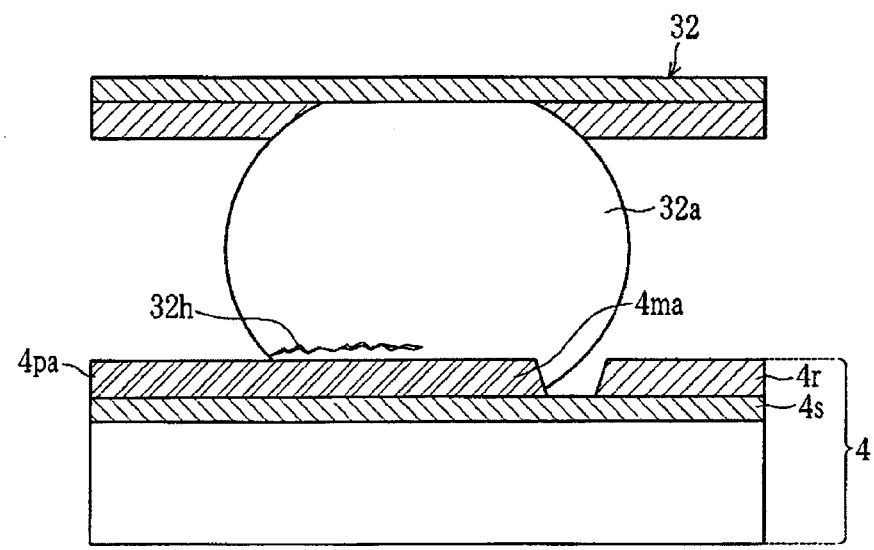
FIG. 8 is a cross-sectional view illustrating a connection state between an electrode pad of the multilayer wiring board and a terminal of the semiconductor package (part 2)

FIG. 8 is a schematic cross-sectional view of the main board 4 taken along a line VIII-VIII in FIG. 6, and illustrates a structure of a wiring pattern 4pa mounted above the mounting surface 4s to connect with the electrode pad 4ma. A soldering structure in FIG. 8 illustrates a result of observation of the solder crack 32h generated in the solder ball 32a after the temperature cycle test by the inventors.

The wiring pattern 4pa is formed above the mounting surface 4s of the main board 4 and connects with the electrode pad 4ma. An upper surface of the wiring pattern 4pa and the upper surface of the electrode pad 4ma are coplanar. In this case, the solder crack 32h is likely to occur at the end of the sphere of the solder ball 32a adjacent to a portion where the upper surface of the electrode pad 4ma and the wiring pattern 4pa are coplanar. For example, in the cross-sectional view of FIG. 8, the solder crack 32h occurs at the end of one side of the sphere. In the worst case, this solder crack 32h causes the electrical connection failure.

In the present embodiment, the lead-out wiring pattern 4pa connects to each of the electrode pads 4ma for the power supply terminals V1 having the same function in the semiconductor package 32. The solder resist 4r is applied to the mounting surface 4s with a distance from the electrode pad 4ma and the wiring pattern 4pa.

For example, plural power supply terminals V1 that serve as the power supply voltage terminals VDD are provided in the semiconductor package 32. When the electrical connection failure occurs in one of the power supply terminals V1 due to the solder crack 32h, and when the power supply voltage can be secured by another power supply terminal V1, the soldering structure of the electrode pad 4ma may be employed.

Even when the electrical connection failure occurs in one of the electrode pad 4ma, and when the power supply voltage can be received from any of the other power supply terminals V1 (that is, for example, the other three VDD terminals when a subjected terminal is the VDD terminal), the functional operation of the SDRAM 32 can be secured. It is preferable that at least one VDD terminal of the other three VDD terminals has the wiring pattern 4p in the inner layer L1 as shown in FIG. 7. As such, the reliability of the electrical connection can be further improved.

Figure 9:
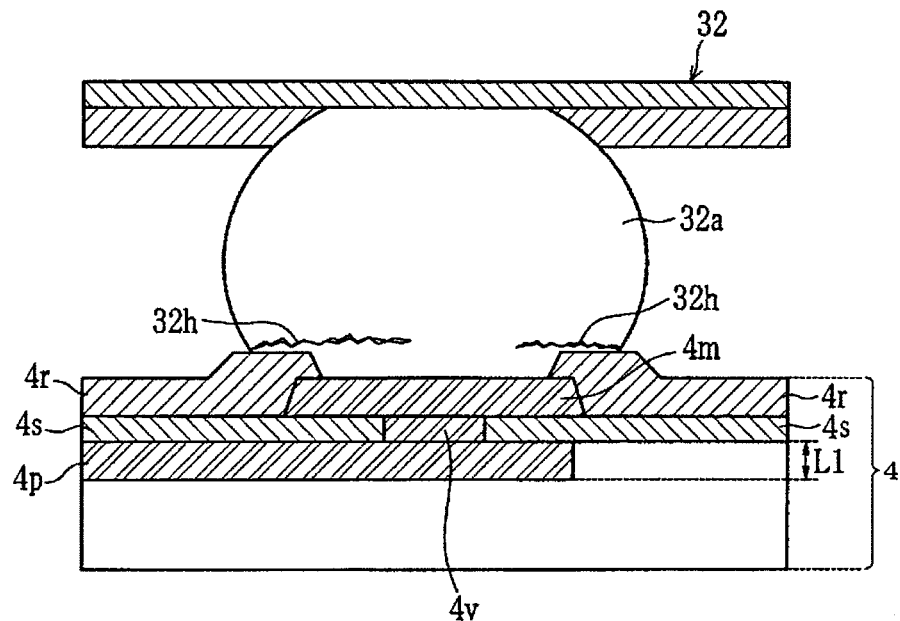
FIG. 9 is a cross-sectional view illustrating a connection state between an electrode pad of a multilayer wiring board and a terminal of a semiconductor package as a comparative example (part 1)
Figure 10:
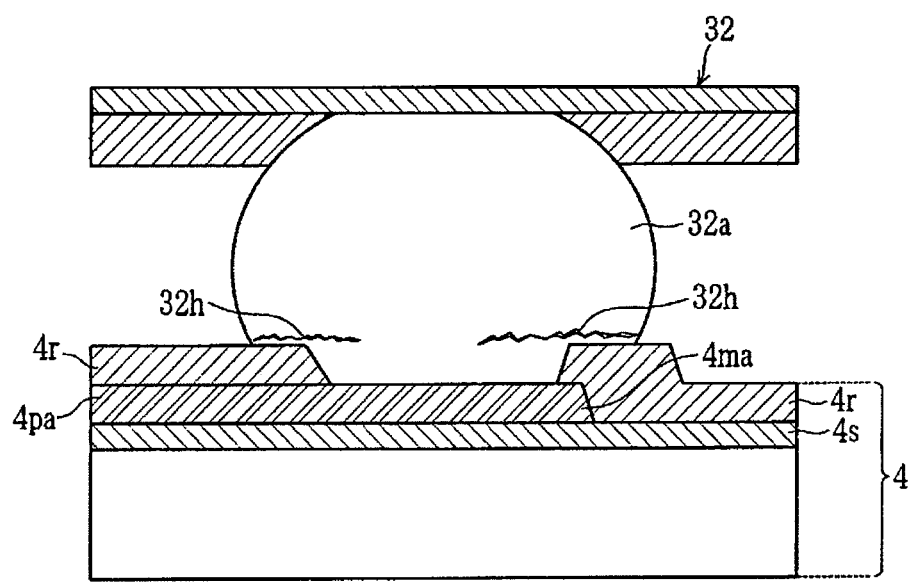
FIG. 10 is a cross-sectional view illustrating a connection state between an electrode pad of the multilayer wiring board and a terminal of the semiconductor package as the comparative example (part 2).

FIG. 9 and FIG. 10 illustrate comparative structures. As shown in FIG. 9 and FIG. 10, a structure in which the solder resist 4r covers ends of the upper surface and the side surface of the electrode pad 4m (so-called an over resist structure) is commonly used. Each of soldering structures shown in FIG. 9 and FIG. 10 schematically illustrates a result of observation of the solder crack after the temperature cycle test by the inventors.

When the solder ball 32a is soldered on the solder resist 4r as shown in FIG. 9 and FIG. 10, an upper opening portion of the electrode pad 4m or 4ma is narrower than that of the structure of FIG. 7 or FIG. 8. Therefore, it was confirmed that the solder cracks 32h are likely to occur at the end of the sphere of the solder ball 32a adjacent to the solder resists 4r applied to the both ends of the electrode pad 4m or 4ma. As described above, there is a possibility that the SDRAM 32 cannot secure the functional operation due to the electrical connection failure caused by the solder crack 32h.

According to the present embodiment, the electrode pad 4m for the signal terminal S1 of the semiconductor package 32 has the wiring pattern 4p in the inner layer L1 of the main board 4. The solder resist 4r is applied to the mounting surface 4s of the main board 4 and is spaced from a periphery of the electrode pad 4m to the exterior. The solder ball 32a covers the upper surface and the upper end of the side surface of the electrode pad 4m. As a result, the occurrence of the solder crack 32h in the solder ball 32a can be restricted and the signal terminal S1 is electrically connected with high reliability.

Each of the electrode pads 4ma for the plural power supply terminals V1 of the semiconductor package 32 (for example, VDD terminals) has the wiring pattern 4p above the mounting surface 4s. Even when the electrical connection failure occurs due to the solder crack 32h under the harsh environment in the vehicle, the power supply voltage can be secured through the electrode pads 4m of the other power supply terminals V1. Therefore, the functional operation failure of the semiconductor package 32 can be restricted and a functionality can be secured.

Especially, the deviation in expansion and contraction of the mounting region of the main board 4 at the outermost portion of the semiconductor package 32 is large, and the solder crack 32h is likely to occur in the mounting region. The electrode pad 4m for the solder ball 32a provided at the outermost portion of the semiconductor package 32 has the wiring pattern 4p in the inner layer L1 different from the layer above the mounting surface 4s on which the electrode pad 4m is disposed.

Since the solder ball 32a is welded to cover the upper surface and the upper end of the side surface of the electrode pad 4m, the occurrence of the solder crack 32h can be restricted. When the semiconductor package 32 is the BGA package, the above-described situation is likely to easily occur and thus the above-described effects improve. However, the above-described soldering structure may be employed for semiconductor packages having any other package structures.

While only the selected exemplary embodiments have been chosen to illustrate the present disclosure, the present disclosure is not limited to the said embodiments and structures. Various changes and modification can be made in the present disclosure. Furthermore, various combination and formation, and other combination and formation including one, more than one or less than one element can be made in the present disclosure.

The invention claimed is:

1. A vehicular electronic device comprising:
a semiconductor package having a plurality of power supply terminals and a signal terminal, wherein a power supply input function is assigned to each of the plural power supply terminals, and at least one of a signal input function and a signal output function is assigned to the signal terminal; and
a multilayer wiring board having a first electrode pad through which each of the power supply terminals of the semiconductor package is mounted on and soldered to a mounting surface of the multilayer wiring board, and a second electrode pad through which the signal terminal is mounted on and soldered to the mounting surface, wherein
the multilayer wiring board has a first wiring pattern in a layer above the mounting surface of the multilayer wiring board on which the first electrode pad is disposed, the first wiring pattern connecting to the first electrode pad, and a solder resist being disposed on the mounting surface of the multilayer wiring board,
the second electrode pad has a second wiring pattern in a layer different from the layer above the mounting surface, the second electrode pad being disposed in an opening of the solder resist and apart from the solder resist, and
the signal terminal of the semiconductor package is soldered to the second electrode pad of the multilayer wiring board so that a solder ball of the signal terminal covers and is in contact with an entire upper surface and an upper end of a side surface of the second electrode pad, and so that the solder ball of the signal terminal does not cover the solder resist disposed on the mounting surface of the multilayer wiring board.

2. The vehicular electronic device according to claim 1, wherein
the second electrode pad of the signal terminal provided at an outermost portion of the semiconductor package has the second wiring pattern in the layer different from the layer above the mounting surface.

3. The vehicular electronic device according to claim 1, wherein
the entire upper surface and the upper end of the side surface of the second electrode pad are disposed in the signal terminal.

4. The vehicular electronic device according to claim 1, wherein
the semiconductor package is a ball-grid-array type package having a plurality of solder balls; and
the signal terminal is one of the plurality of solder balls of the semiconductor package.

5. A vehicular electronic device comprising:
a semiconductor package having a plurality of power supply terminals and a signal terminal, wherein a power supply input function is assigned to each of the plural power supply terminals, and at least one of a signal input function and a signal output function is assigned to the signal terminal; and
a multilayer wiring board having a first electrode pad through which each of the power supply terminals of the semiconductor package is mounted on and soldered to a mounting surface of the multilayer wiring board, and a second electrode pad through which the signal terminal is mounted on and soldered to the mounting surface, wherein
the multilayer wiring board has a first wiring pattern in a layer above the mounting surface of the multilayer wiring board on which the first electrode pad is disposed, the first wiring pattern connecting to the first electrode pad, a solder resist being disposed on the mounting surface of the multilayer wiring board, the layer of the first wiring pattern being the same layer as the first electrode pad, and the first wiring pattern being continuously disposed with the first electrode pad,
the second electrode pad has a second wiring pattern in a layer different from the layer above the mounting surface and different from a layer of the second electrode pad, the second electrode pad being disposed in an opening of the solder resist and apart from the solder resist, and
the signal terminal of the semiconductor package is soldered to the second electrode pad of the multilayer wiring board using a solder ball, the solder ball being in direct contact with an entire upper surface of the second electrode pad and an upper end of a side surface of the second electrode pad, the upper end of the side surface of the second electrode pad extending directly from the upper surface of the second electrode pad, and the solder ball not covering the solder resist disposed on the mounting surface of the multilayer wiring board.

6. The vehicular electronic device according to claim 5, wherein
the second electrode pad of the signal terminal provided at an outermost portion of the semiconductor package has the second wiring pattern in the layer different from the layer above the mounting surface.

7. The vehicular electronic device according to claim 5, wherein
the entire upper surface and the upper end of the side surface of the second electrode pad are disposed in the solder ball.

8. The vehicular electronic device according to claim 1, wherein
the layer of the first wiring pattern is the same layer as the first electrode pad and the first wiring pattern is continuously disposed with the first electrode pad, and
the layer of the second wiring pattern is different from a layer of the second electrode pad.

9. A vehicular electronic device comprising:
a semiconductor package having a plurality of power supply terminals and a signal terminal, wherein a power supply input function is assigned to each of the plural power supply terminals, and at least one of a signal input function and a signal output function is assigned to the signal terminal; and
a multilayer wiring board having a first electrode pad through which each of the power supply terminals of the semiconductor package is mounted on and soldered to a mounting surface of the multilayer wiring board, and a second electrode pad through which the signal terminal is mounted on and soldered to the mounting surface, wherein
the multilayer wiring board has a first wiring pattern in a layer above the mounting surface of the multilayer wiring board on which the first electrode pad is disposed, the first wiring pattern connecting to the first electrode pad, the layer of the first wiring pattern being the same layer as the first electrode pad, and the first wiring pattern being continuously disposed with the first electrode pad
the second electrode pad has a second wiring pattern in a layer different from the layer above the mounting surface and different from a layer of the second electrode pad, and the signal terminal of the semiconductor package is soldered to the second electrode pad of the multilayer wiring board so that the signal terminal covers and is in contact with an entire upper surface and an upper end of a side surface of the second electrode pad.

* * * * *